United States Patent
Immer et al.

(10) Patent No.: US 10,761,034 B2
(45) Date of Patent: Sep. 1, 2020

(54) EXPEDITING SPECTRAL MEASUREMENT IN SEMICONDUCTOR DEVICE FABRICATION

(71) Applicant: KLA-Tencor Corporation, Milpitas, CA (US)

(72) Inventors: Vincent Immer, Zikron Yaakov (IL); Tal Marciano, Zychron Yaacov (IL); Etay Lavert, Givat Ella (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/568,958

(22) PCT Filed: Aug. 23, 2017

(86) PCT No.: PCT/US2017/048276
§ 371 (c)(1),
(2) Date: Oct. 24, 2017

(87) PCT Pub. No.: WO2018/067243
PCT Pub. Date: Apr. 12, 2018

(65) Prior Publication Data
US 2018/0372652 A1 Dec. 27, 2018

Related U.S. Application Data

(60) Provisional application No. 62/403,712, filed on Oct. 4, 2016.

(51) Int. Cl.
*G01N 21/55* (2014.01)
*G01N 21/95* (2006.01)
(Continued)

(52) U.S. Cl.
CPC .......... *G01N 21/9501* (2013.01); *G01J 3/453* (2013.01); *G01N 21/31* (2013.01); *G01N 21/55* (2013.01); *G01N 21/956* (2013.01); *G02B 21/0016* (2013.01); *G02B 21/0056* (2013.01); *G02B 21/06* (2013.01); *G02B 21/082* (2013.01); *G02B 21/18* (2013.01); *G02B 21/365* (2013.01);
(Continued)

(58) Field of Classification Search
CPC .......... G01N 21/9501; G01N 21/9503; G01N 21/956; G02B 21/0016; G01J 3/45
See application file for complete search history.

(56) References Cited

U.S. PATENT DOCUMENTS 6,943,353 B2  9/2005  Elmore et al.
6,963,405 B1  11/2005  Wheel et al.
(Continued)

FOREIGN PATENT DOCUMENTS

KR  101186464 B1  9/2012
KR  20140133992 A  11/2014
KR  20160082076 A  7/2016

OTHER PUBLICATIONS

ISA/KR, International Search Report for PCT/US2017/048276 dated Dec. 22, 2017.

*Primary Examiner* — Maurice C Smith
(74) *Attorney, Agent, or Firm* — Hodgson Russ LLP

(57) ABSTRACT

A device and method for expediting spectral measurement in metrological activities during semiconductor device fabrication through interferometric spectroscopy of white light illumination during calibration, overlay, and recipe creation.

8 Claims, 9 Drawing Sheets

(51) Int. Cl.
*G01N 21/956* (2006.01)
*G03F 7/20* (2006.01)
*G01N 21/31* (2006.01)
*G02B 21/00* (2006.01)
*G02B 21/08* (2006.01)
*G01J 3/453* (2006.01)
*G02B 21/06* (2006.01)
*G02B 21/18* (2006.01)
*G02B 21/36* (2006.01)
*H01L 21/67* (2006.01)
*H01L 21/66* (2006.01)

(52) U.S. Cl.
CPC .... *G03F 7/70633* (2013.01); *H01L 21/67259* (2013.01); *H01L 22/12* (2013.01)

(56) References Cited

U.S. PATENT DOCUMENTS

2009/0182528 A1* 7/2009 De Groot ............... G01B 11/06
 702/167
2014/0239181 A1* 8/2014 Hattori ............... G01B 11/0625
 250/339.08

* cited by examiner

EXPEDITING SPECTRAL MEASUREMENT IN SEMICONDUCTOR DEVICE FABRICATION

BACKGROUND OF THE INVENTION

Typically, spectral information used in metrological activities associated with semiconductor device manufacture is acquired through relatively time consuming spectral measurements during calibration, overlay activities, recipe creation, and other metrological activities. Spectral measurements many times increase overall processing time thereby reducing process efficiency. Therefore, there is a need to expedient acquisition of robust spectral information enabling a wide range of metrological activities in a manner preserving fabrication speed and efficiency.

SUMMARY OF THE INVENTION

According to the teachings of the present invention there is provided an interferometric-spectroscopy metrology tool including an interferometric microscope configured to create an interferogram from light beams derived from white light illumination during vertical conveyance of a focal lens, the interferogram captured by a single-pixel detector associated with the interferometric microscope; and a computer configured to render the interferogram into a frequency spectrum through application of a Fourier transformation on the interferogram.

According to a further feature of the present invention, the light beams include a beam reflected from a broadband reflector so as to characterize a spectrum of the white light illumination in the interferogram.

According to a further feature of the present invention, the broad band reflector is implemented as a mirror.

According to a further feature of the present invention, the broad band reflector is implemented as bare silicon.

According to a further feature of the present invention, the light beams include a beam reflected from a processed wafer so as to characterize a product of a spectrum of white light illumination and a spectrum of spectral reflectivity of the processed wafer in the interferogram.

According to a further feature of the present invention, the interferometric microscope includes a Linnik beam splitter cube.

There is also provided according to the teachings of the present invention, a method of expediting acquisition of spectral data in semiconductor device fabrication metrology; the method including:

splitting white light illumination into two light beams with an interferometric microscope;

receiving an interferogram on a single-pixel detector, the interferogram formed from recombination of the light beams; and applying a Fourier transform to the interferogram so as to render the interferogram into a frequency spectrum characterizing the white light illumination.

According to a further feature of the present invention, there is also provided reflecting one of the light beams off a broadband reflector.

According to a further feature of the present invention, the broadband reflector is implemented as a mirror.

According to a further feature of the present invention, the broadband reflector is implemented as a bare wafer.

There is also provided according to the teachings of the present invention, splitting white light illumination into a reference light beam and a test light beam with the interferometric microscope;

capturing an interferogram on the single-pixel detector during focusing of the white light illumination during overlay sequence, the interferogram formed from recombination of the light beams, the test light beam reflected from a processed wafer having microstructures; and applying a Fourier transform to the interferogram so as to render the interferogram into a composite frequency spectrum characterizing both the white light illumination and spectral reflectivity of the processed wafer.

According to a further feature of the present invention, there is also provided dividing the composite frequency spectrum by the frequency spectrum of the white light illumination so as to generate a frequency spectrum characterizing a reflectivity of the processed wafer.

There is also provided according to the teachings of the present invention, an interferometric-spectroscopy metrology tool including an interferometric microscope configured to create an interferogram from white light illumination, the microscope having, a horizontally conveyable reference mirror or a conveyable beam splitter cube, a focal lens fixed at a focal distance from a processed wafer; a two-dimensional, pixel-array detector configured to capture multiple, pixel-specific interferograms in accordance with a changing optical path distance of light beams derived from the white light illumination; and a computer configured to apply a Fourier transform on each of the pixel-specific interferograms so as to generate a pixel-specific, frequency spectrum associated with each corresponding area of the processed wafer.

According to a further feature of the present invention, the computer is further configured to construct a synthetic image of at least one chosen centroid wavelength and respective chosen bandwidth.

According to a further feature of the present invention, the computer is further configured to apply a metric to the synthetic image.

According to a further feature of the present invention, the metric is selected from the group consisting of overlay metric Region of Investigation (ROI) of the processed wafer, average reflectivity, 3S, contrast, and target asymmetry.

There is also provided according to the teachings of the present invention, a method of expediting acquisition of hyperspectral data in semi-conductor device fabrication metrology, the method including splitting white light illumination with an interferometric microscope into two light beams; changing an optical path distance traveled by the light beams while maintaining focus on the processed wafer; capturing a pixel-specific interferograms on a two-dimensional, pixel-array detector in accordance with the changing optical path distance traveled by the light beams; applying a Fourier transformation to each pixel-specific interferogram so as to generate a pixel-specific, frequency spectrum of the processed wafer; and assigning pixel, grey levels proportional to a chosen pixel, centroid frequency and bandwidth.

According to a further feature of the present invention, the changing the optical path distance is implemented through horizontal conveyance of the reference mirror.

According to a further feature of the present invention, the changing the optical path distance is implemented through conveyance of the beam splitter.

BRIEF DESCRIPTION OF THE DRAWINGS

The subject matter regarded as the invention is particularly pointed out and distinctly claimed in the concluding portion of the specification. In regard to the invention, constituent components and their configuration and features, method of operation, objectives, and advantages are most clearly understood with reference to the following detailed description in view of the accompanying drawings in which:

It should be appreciated that figure elements are not drawn to scale and for the sake of clarity, corresponding elements in various figures are identically labeled.

DETAILED DESCRIPTION

In the following description, numerous details are set forth to facilitate a clear understanding of the invention and it should be appreciated that the present invention may be practiced without these specific details. Furthermore, well-known methods, components and procedures are omitted to highlight the present invention.

The following terminology will be used through this document:

"Metrological activities" includes and not limited to any one or combination metrological tests:

"Overlay metrology" (OVL) refers to a technique for evaluating alignment between upper and lower layer patterns most effectively evaluated at certain wavelengths.

The OVL variance is calculated as the difference between centers of symmetry of inner and outer overlay targets.

"Kernel3S" refers to a metric that is three times the variance of the OVL calculated by three different overlying parts of the same overlay targets. It should be as small as possible while high values may indicate bad portability, variation over the target, bad recipe.

"Phase linearity" refers to a metric indicating variance of the OVL as given by the contribution of different harmonics.

"Through focus" is a metric implemented as overlay variation as a function of focus position.

"Contrast precision" refers to contrast between targets and is a function of the degree of measurable, high contrast possessed by grating structure image.

It should be appreciated that pixel-specific interferograms or spectra are associated with corresponding wafer sites.

The present invention is an interferometric-spectroscopy metrology tool employed in semiconductor device fabrication. In one embodiment, the tool is implemented as an overlay tool configured to identify optimal focus position during overlay sequence and in another embodiment the tool is implemented as a hyperspectral imaging tool for facilitating in recipe creation and other metrics.

Figure 1:
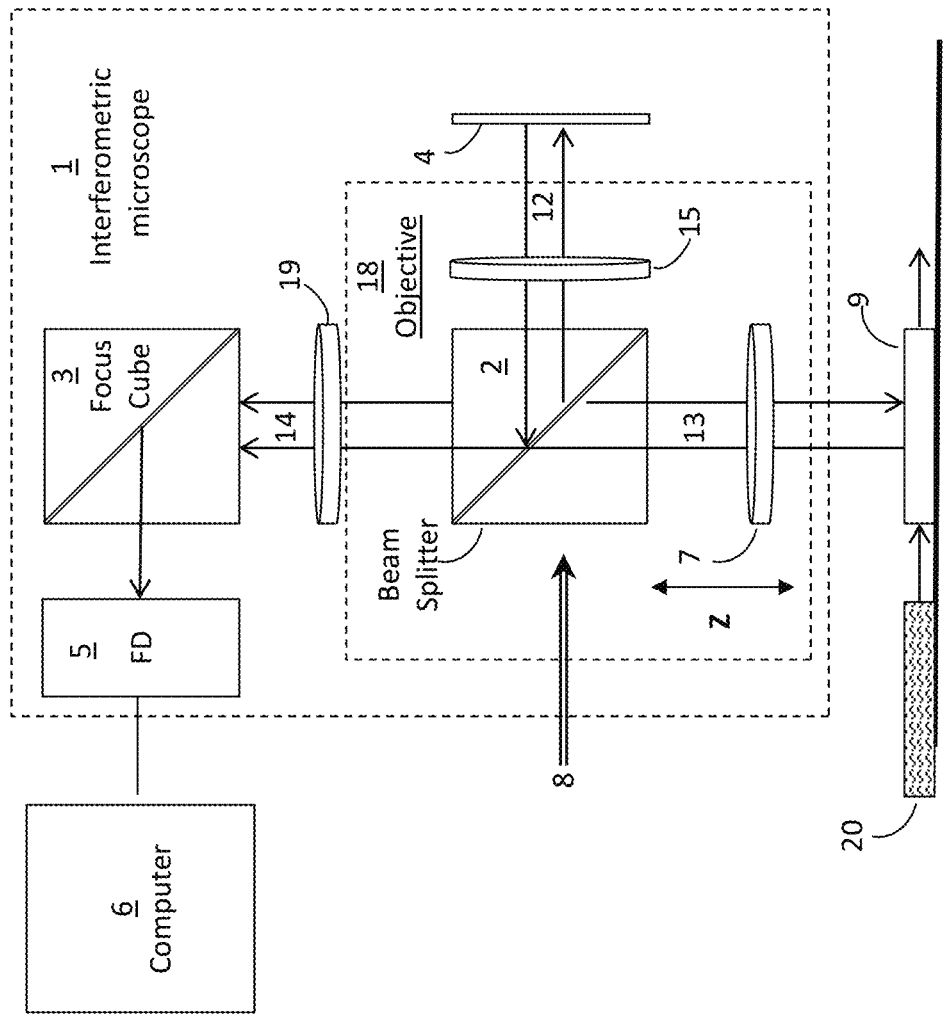
FIG. 1 is a schematic diagram of an imaging overlay tool employing an interferometric, imaging microscope, implemented with a single-pixel detector according to an embodiment.
Figure 2:
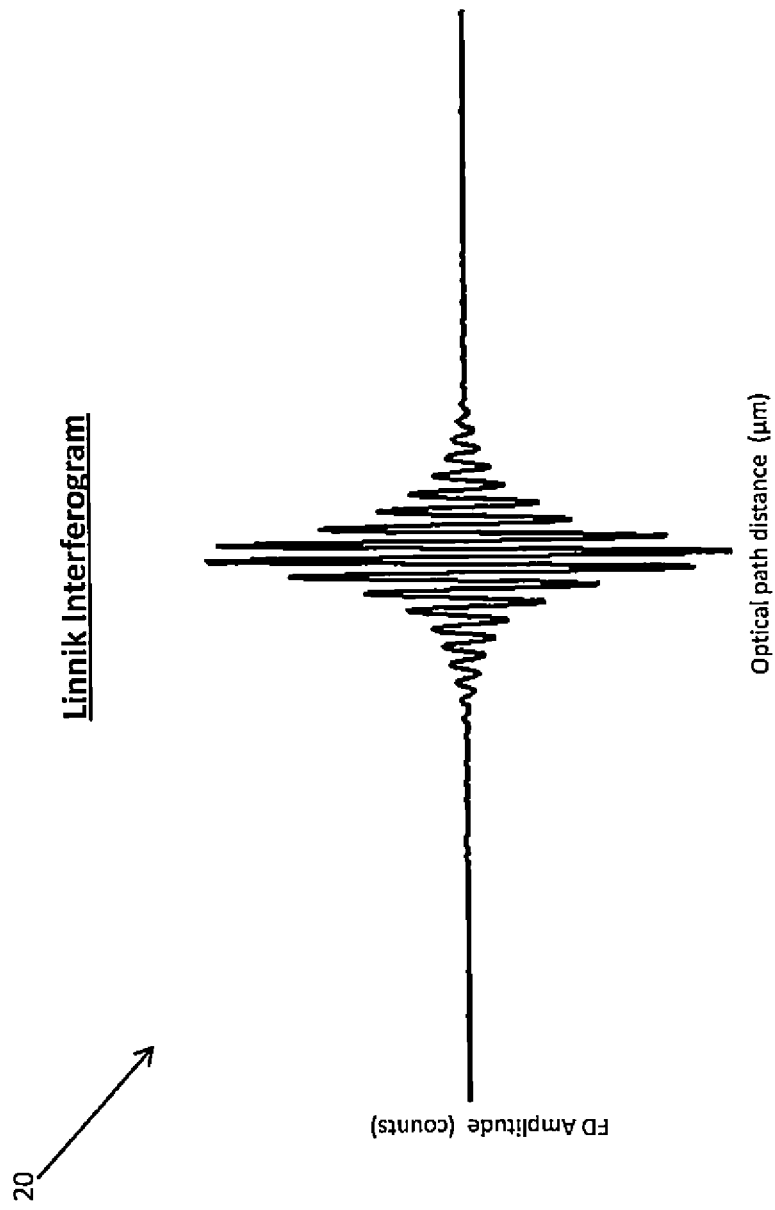
FIG. 2 is an interferogram captured by the imaging overlay tool of FIG. 1, according to an embodiment.

In reference to FIGS. 1 and 2, FIG. 1 is a schematic depiction of interferometric-spectroscopy, metrology tool including a computer 6 linked to an interferometric, imaging microscope 1 having a beam splitter cube 2, a focus cube 3, a horizontally-conveyable, reference mirror 4, a single-pixel, focus detector 5, vertically-conveyable, focal lens 7, horizontal focus lens 15, and a tube lens 19.

During vertical conveyance of focal lens 7 in direction Z in an overlay sequence, white light illumination 8 is split by beam splitter cube 2 into horizontal beam 12 and directed to reference mirror 4 and a vertical light beam 13 and directed to broad band reflector 9. Reflected light beams 12 and 13 are recombined at beam splitter cube 2 as is known in the art. Recombined beam 14 is directed to focus cube 3 through tube lens 19 and then to single pixel detector 5, according to an embodiment. When the optical path difference (OPD) between the horizontal and vertical light beams 12 and 13 approaches zero, a computer 6 linked to single-pixel detector 5 generates an interferogram as a plot of intensity counts as a function of OPD in micrometers as depicted in FIG. 2. A best focal point is identified as the maximum amplitude point from the envelope of the interferogram. Computer 6 renders interferogram into a frequency spectrum through application of a Fourier transform as is known to those skilled in Fourier Transform Spectroscopy (FTS) as set forth in *"Introductory Fourier Transform Spectroscopy"* by Robert John Bell, for example.

Figure 3A:
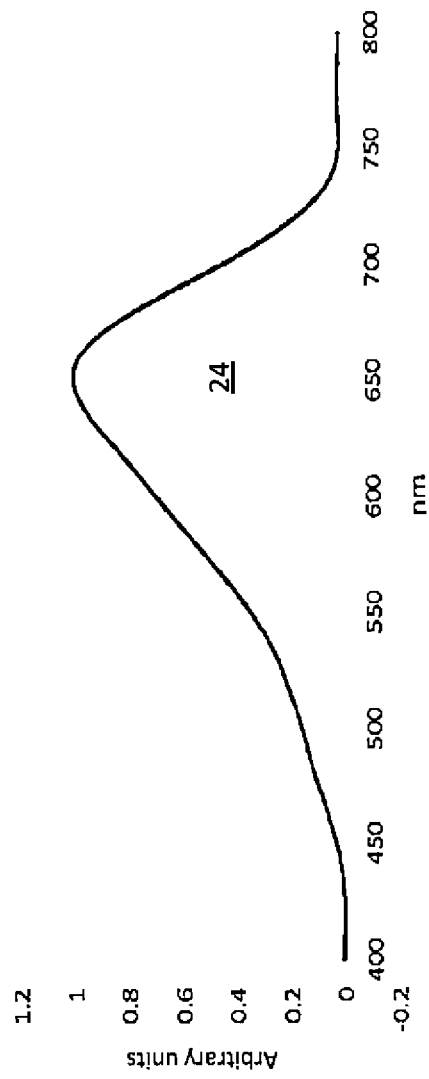
FIG. 3A is a frequency spectrum derived from a Fourier transformation of the interferogram of FIG. 2, according to an embodiment.
Figure 3B:
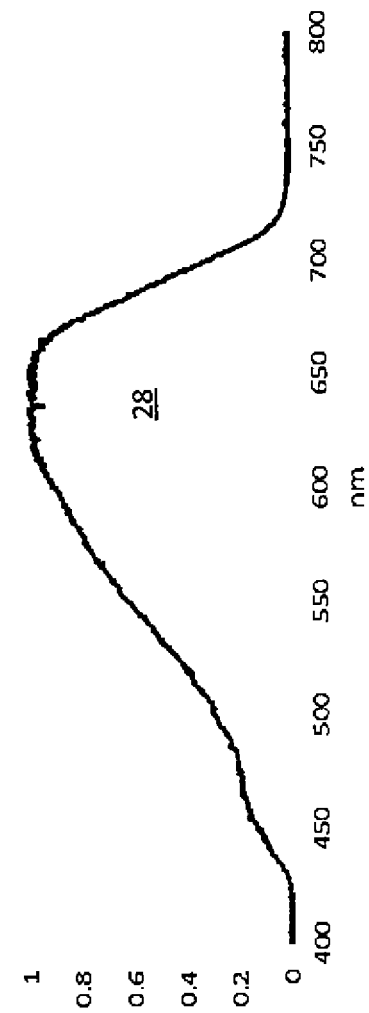
FIG. 3B is a frequency spectrum measured with a spectrometer depicting the substantial correspondence with frequency spectrum derived from Fourier transformation of the interferogram of FIG. 3A; according to an embodiment.

FIG. 3A depicts a frequency spectrum of white light spectrum characteristic of the interferogram of FIG. 2 after Fourier transformation and FIG. 3B is a frequency spectrum obtained through direct measurement through spectral measurements. A comparison of the two normalized spectra shows the semblance of the FTS derived spectrum with the measured spectrum. The deviation between the spectra of FIGS. 3A-3B is a result of the responsivity of single pixel detector 5 employed in the FTS spectrum being non-normalized with the detector employed in the spectrometer.

Returning to FIG. 1, as shown vertical light beam 13 is first directed to a broad band reflector 9 implemented as either a mirror or a bare wafer. The resulting spectrum of the white light illumination may be used to calibrate the illumination spectrum.

After a calibration spectrum is obtained, the process is repeated for processed wafer 20 so as to generate composite spectrum that is a product of the white light illumination spectrum and the spectral responsivity of processed wafer 20.

Figure 4:
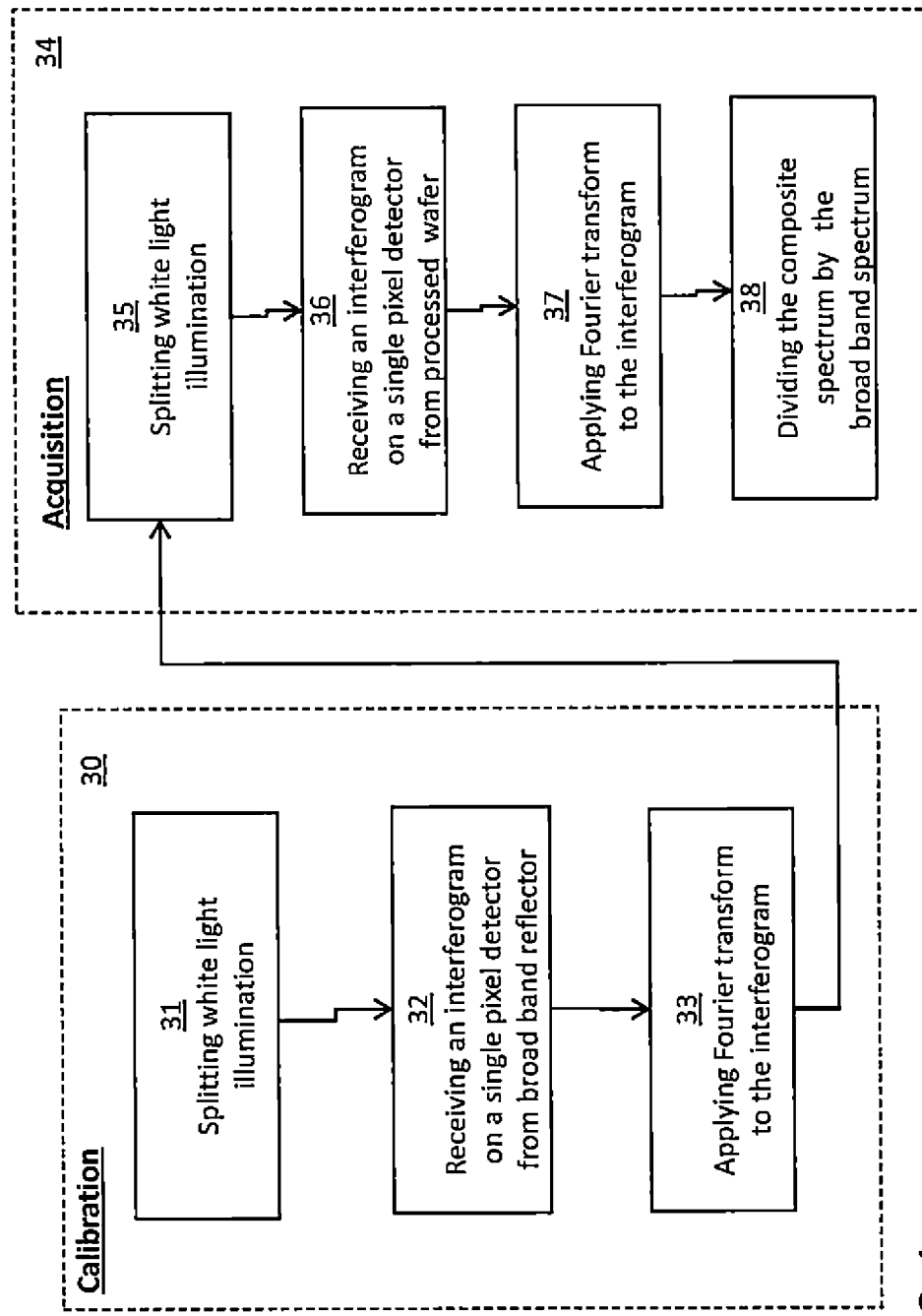
FIG. 4 is a flow chart of a method of expediting acquisition of spectral data while focusing in an overlay sequence, according to an embodiment.

FIG. 4 depicts a flow chart for expediting acquisition of spectral data during overlay sequence and is divided into two stages; a calibration stage 30 and an acquisition stage 34, according to an embodiment. As shown, at step 31 white light illumination and vertical beam is reflected from a broad band reflector 9, as noted above. At step 32 an interferogram is captured, at step 33 the interferogram is transformed into a frequency or wavelength spectrum of the white light illumination. Acquisition stage 34 begins at step 35 in which additional white light illumination is again split into two beams and a vertical beam is directed to processed wafer 20 as depicted in FIG. 1. In step 36, an interferogram is captured while focusing lens 7 and holding reference mirror 4 in a single position during overlay sequence. In step 37 a Fourier transformation of the interferogram is performed to produce a composite spectrum of the illumination and wafer reflectivity. In step 38, the composite spectrum is rendered into a reflectivity spectrum by dividing the composite spectrum by the illumination spectrum, as is known in the art.

When the interferometric-spectroscopy metrology tool is implemented as an overlay tool it advantageously leverages existing Linnik-beam-splitter interferometer by widening its use to provide spectral measurement of illumination sources and wafer reflectivity in the absence of a spectrometer. When the target is a broad band reflector, the tool can be used to calibrate the illumination source tool, as noted above, and when the target is implemented as a processed wafer, the tool facilitates generation of spectral reflectivity maps useful in the assessment of process variation and recipe creation. Furthermore, the derived spectral frequency data can be advantageously used to correct skewed overlay measurements resulting from deviation of wafer process parameters like film thickness, refractive indexes, for example.

Additionally, the required interferometric data is acquired during focusing in overlay sequences with no impact on OVL measurement time.

Figure 5:
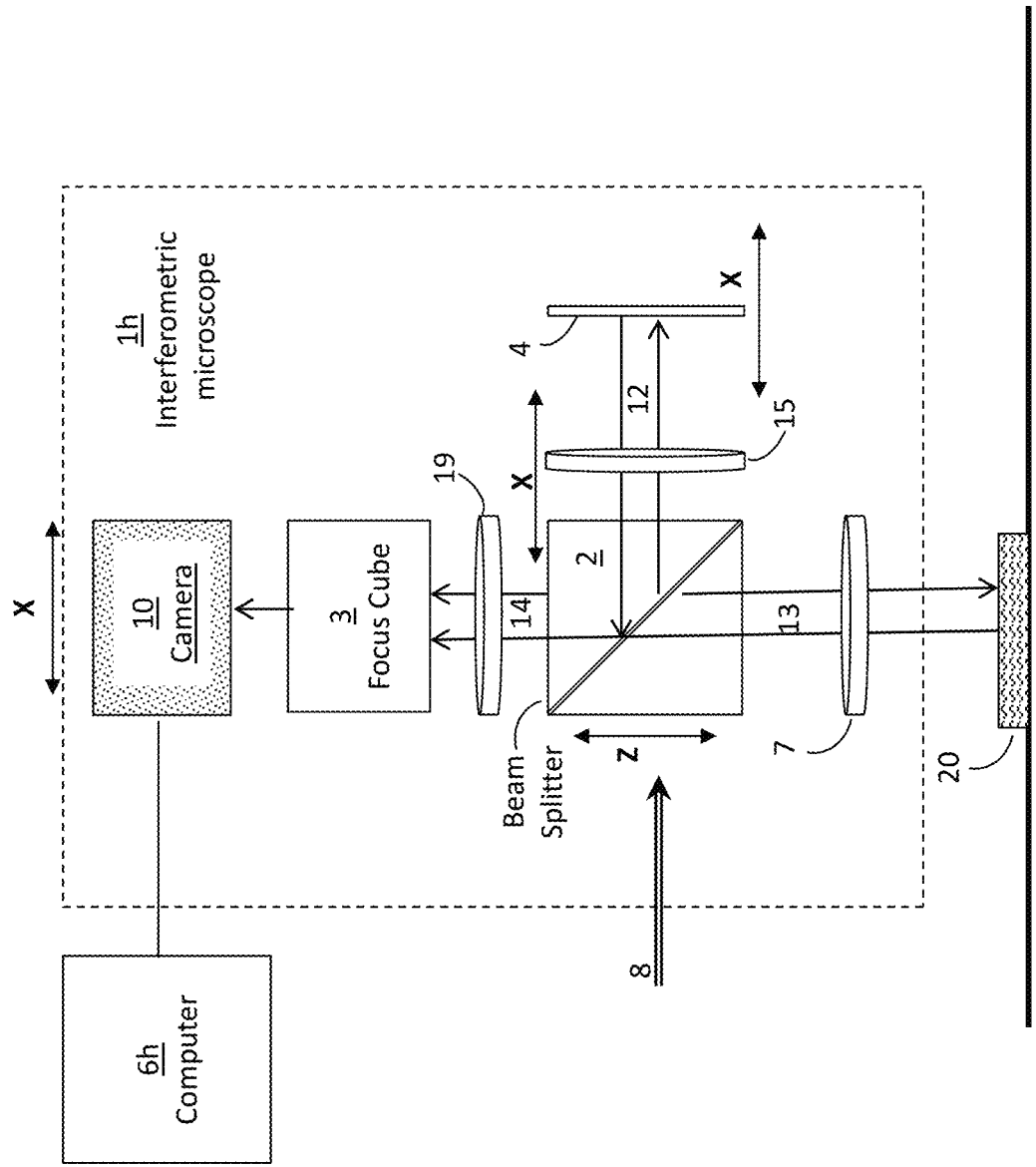
FIG. 5 is a schematic diagram of an imaging overlay tool employing an interferometric, imaging microscope, implemented with a pixel-array detector, according to an embodiment.

FIG. 5 depicts an embodiment of the interferometric-spectroscopy metrology tool implemented as a hyperspectral imaging tool configured to synthesize images in accordance with centroids of interferometrically-derived reflectivity spectra.

The tool includes a horizontally-conveyable, interferometric microscope 1h employing a pixel-array detector (camera) 10, a vertically conveyable, beam-splitter cube 2, a focus cube 3, a horizontally-conveyable, reference mirror 4, a focal lens 7 held at a focal distance from a target, horizontal focus lens 15, a tube lens 19, a computer 6h linked to pixel-array detector 10 and configured to render each pixel-specific interferogram into a pixel-specific reflectivity spectrum. In a certain embodiment computer 6h is further configured to synthesize a synthetic image proportional to chosen centroid wavelength and chosen bandwidth on the basis of the reflectivity spectra. It should be appreciated that computer 6h includes all necessary input and output equipment.

Figure 6:
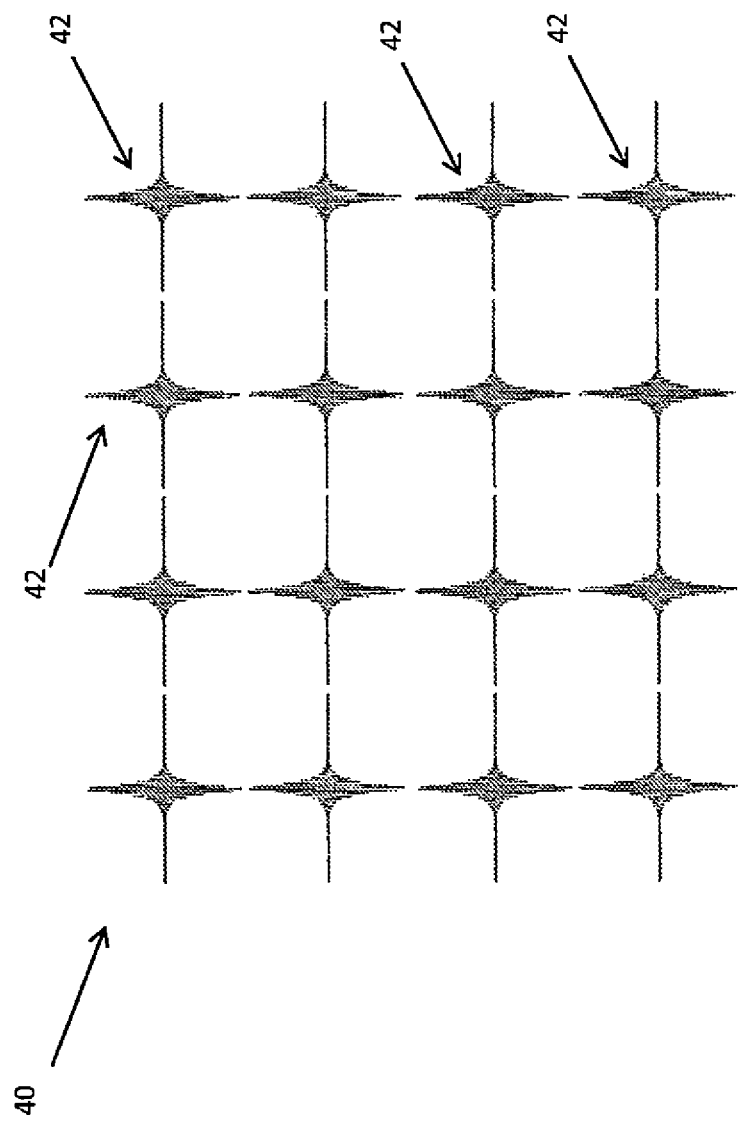
FIG. 6 is an interferogram set of pixel-specific interferograms captured by the imaging overlay tool of FIG. 5, according to an embodiment.

FIG. 6 depicts an interferogram set 40 of multiple, pixel-specific interferograms 42, captured by camera 10, according to an embodiment. Each specific interferogram captured by camera 10 corresponds to a specific site on the target wafer on the wafer plane in an optical imaging system thereby providing robust spectral information at each corresponding site of the wafer.

Figure 7:
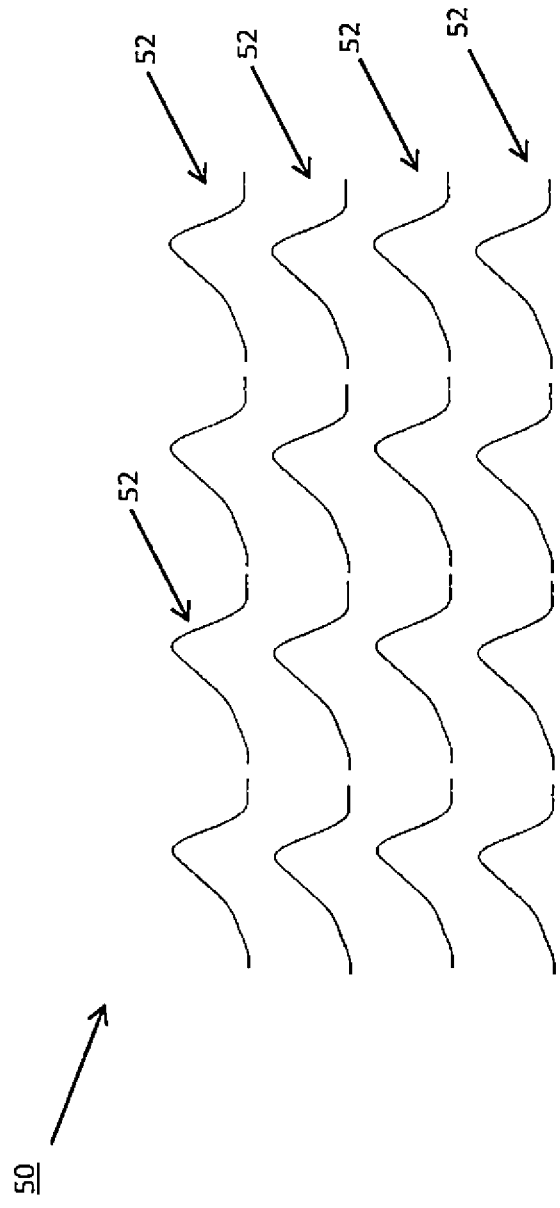
FIG. 7 is a frequency spectrum set derived from Fourier transformation of each of the pixel-specific interferograms of FIG. 6, according to an embodiment.

FIG. 7 depicts a spectrum set 50 of multiple, pixel-specific reflectivity spectra 52, after Fourier transformation of each of the pixel-specific interferogram of FIG. 6, according to an embodiment. Accordingly, each specific spectrum provides robust spectral information at each corresponding site of the wafer.

Figure 8:
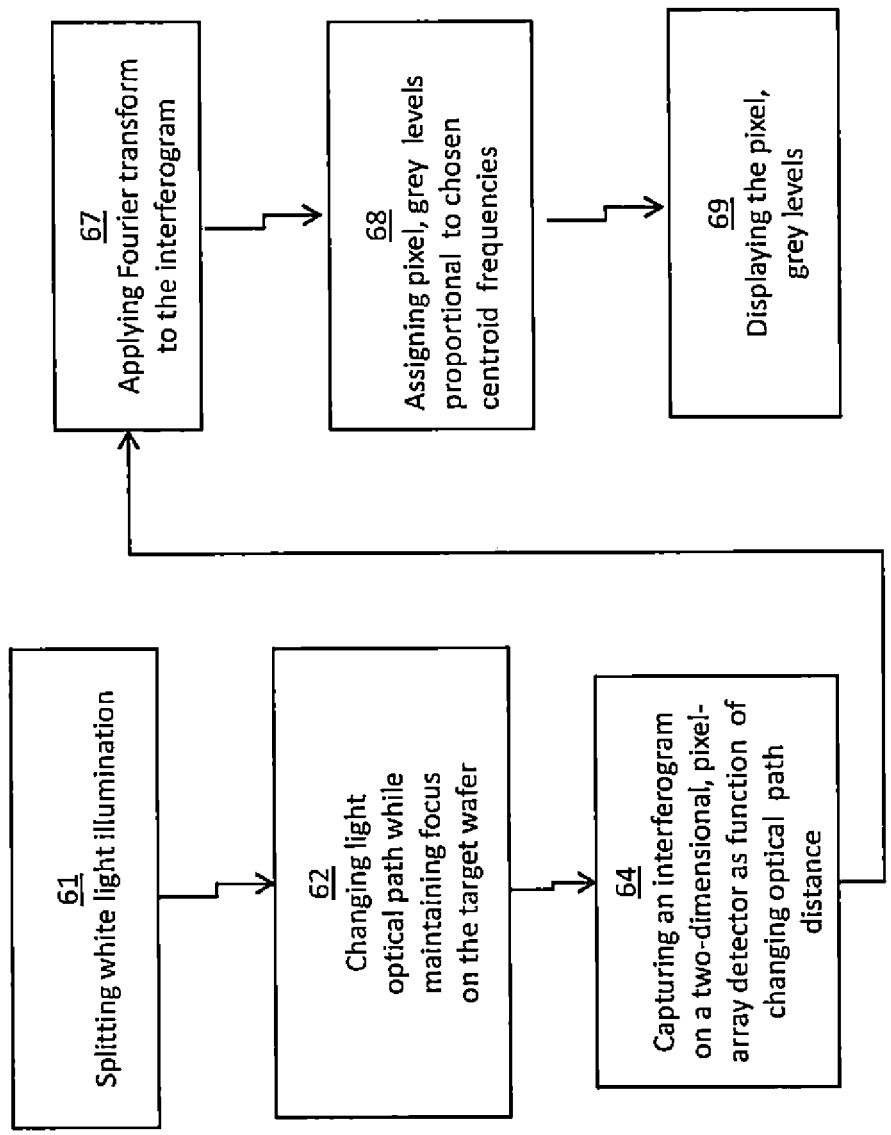
FIG. 8 is a flow chart of a method of expediting hyperspectral imaging of a processed wafer, according to an embodiment.

FIG. 8 depicts a flow chart of the operational steps employed by the hyperspectral imaging tool of FIG. 6 in the syntheses of various synthetic images, according to an embodiment.

In step 61, white light illumination 8 is split by beam splitter 2, in step 62 the optical path distance of beams 12 and 13 is modulated while maintaining focus on processed target wafer 20. The optical path distance of beams 12 and 13 can be modulated through various schemes. In a certain embodiment, light optical path distance modulation is achieved by conveying beam splitter 2 either horizontally or vertically, or, in another embodiment, conveying reference mirror 4 while holding beam splitter 2 in the same position, whereas in another embodiment, optical path modulation is achieved through a combination of these two methods.

In step 64, a set of pixel-specific interferograms 40, as shown in FIG. 6, is captured by camera 10 from recombined light beams 12 and 13. Each pixel of camera 10 corresponds to a wafer site such that each captured interferogram corresponds to the specific location of wafer from which the light 12 reflected, as noted above.

In step 67, computer 6h applies a Fourier transform to each pixel-specific interferogram 42 of the interferogram set 40 so as to render them into spectrum set 50 of pixel-specific frequency spectra 52, as is known in the art.

In step 68, pixel grey levels are assigned that are proportional to a chosen pixel, centroid frequency and chosen bandwidth. It should be appreciated that in a certain embodiment, a plurality of pixel centroids is employed simultaneously to provide desired resolution. It should be appreciated that the grey levels in certain embodiments are implemented as color levels or intensity levels.

In step 69, the pixel, grey levels of the pixel-array detector are displayed in preparation for use with the appropriate metric.

The application of interferometric spectroscopy in hyperspectral imaging of processed wafers advantageously provides significant time savings by reducing the customary, multiple spectral measurements into a single interferometric measurement that after rendering into spectrum provides robust spectral information at every location of the wafer. This spectral information may be utilized during research and development to create a recipe of optimal operational parameters for customer operation, to determine appropriate overlay parameters, and to provide various wavelength viewing options in accordance with the wavelength most suitable for a chosen metrology tool.

Figure 9:
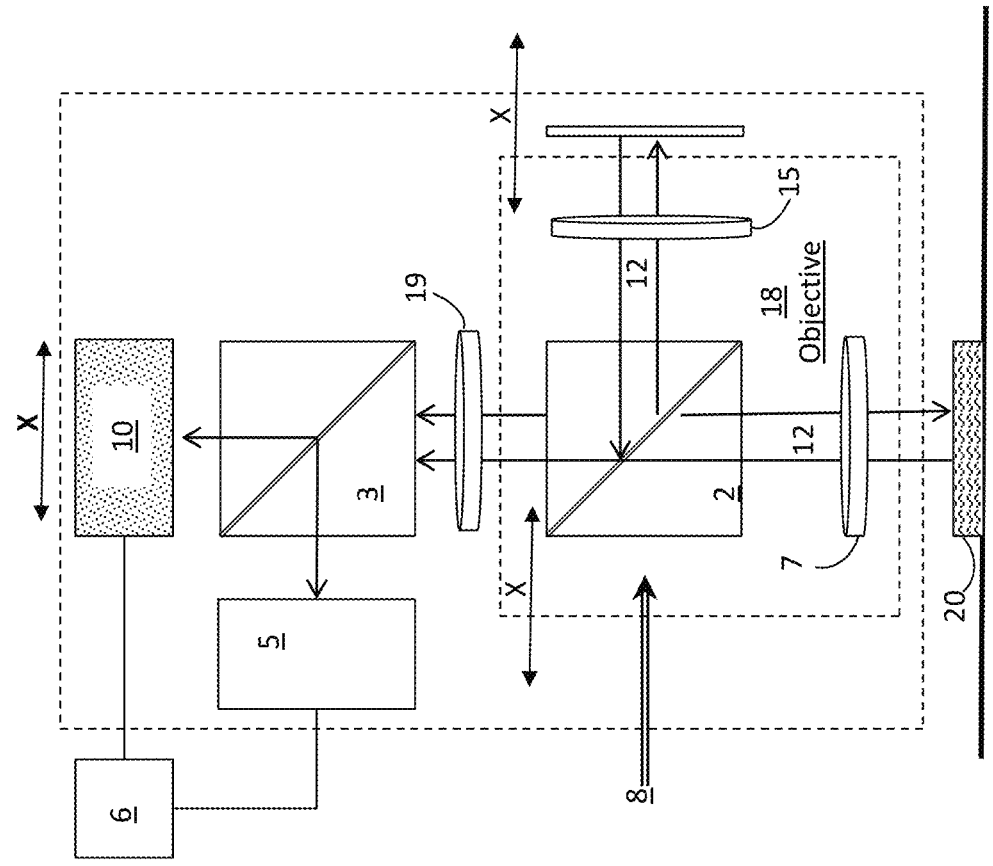
FIG. 9 is a schematic diagram of a combination interferometric-microscope overlay and hyperspectral imaging tool, according to an embodiment.

FIG. 9 depicts an embodiment of combination interferometric-spectroscopy metrology tool implemented with both a camera 10 and a single-pixel detector 5 in addition to the above-described hardware and configurations. The combination interferometric-spectroscopy metrology tool advantageously providing either overlay tool or hyperspectral imaging functionality in accordance with the metrology needs.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. An interferometric-spectroscopy metrology tool comprising:
an interferometric microscope configured to create a first interferogram from light beams derived from a first white light illumination during vertical conveyance of a focal lens, the first interferogram captured by a single-pixel detector associated with the interferometric microscope, wherein the light beams include a beam reflected from a broadband reflector so as to characterize a spectrum of the first white light illumination in the first interferogram; and a computer configured to render the first interferogram into a frequency spectrum through application of a Fourier transformation on the first interferogram;

wherein the interferometric microscope is further configured to create a second interferogram from a second white light illumination during focusing of the second white illumination during overlay sequence, the second white light illumination comprising a reference light beam and a test light beam, the test light beam reflected from a processed wafer having microstructures, the second interferogram captured by the single-pixel detector from the recombination of the reference light beam and the test light beam; and wherein the computer is further configured to render the second interferogram into a composite frequency spectrum characterizing the second white light illumination and the spectral reflectivity of the processed through application of a Fourier transformation on the second interferogram.

2. The tool of claim 1, wherein the broadband reflector is implemented as a mirror.

3. The tool of claim 1, wherein the broadband reflector is implemented as bare silicon.

4. The tool of claim 1, wherein the interferometric microscope includes a Linnik beam splitter cube.

5. A method of expediting acquisition of spectral data in semiconductor device fabrication metrology; the method comprising:

splitting a first white light illumination into two light beams with an interferometric microscope;

reflecting one of the two light beams off a broadband reflector;

receiving a first interferogram on a single-pixel detector, the first interferogram formed from recombination of the two light beams;

applying a Fourier transform to the first interferogram so as to render the first interferogram into a frequency spectrum characterizing the first white light illumination;

splitting a second white light illumination into a reference light beam and a test light beam with the interferometric microscope;

capturing a second interferogram on the single-pixel detector during focusing of the second white light illumination during overlay sequence, the second interferogram formed from recombination of the reference light beam and the test light beam, the test light beam reflected from a processed wafer having microstructures; and applying a Fourier transform to the second interferogram so as to render the second interferogram into a composite frequency spectrum characterizing both the second white light illumination and spectral reflectivity of the processed wafer.

6. The method of claim 5, wherein the broadband reflector is implemented as a mirror.

7. The method of claim 5, wherein the broadband reflector is implemented as a bare wafer.

8. The method of claim 7, further comprising dividing the composite frequency spectrum by the frequency spectrum of the first white light illumination so as to generate a frequency spectrum characterizing a reflectivity of the processed wafer.

* * * * *